(12) United States Patent
Lin et al.

(10) Patent No.: US 6,998,198 B2
(45) Date of Patent: *Feb. 14, 2006

(54) CONTACT HOLE PRINTING BY PACKING AND UNPACKING

(75) Inventors: Burn J. Lin, Hsinchu (TW); Shinn-Sheng Yu, Taichung (TW); Bang Chein Ho, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 146 days.

This patent is subject to a terminal disclaimer.

(21) Appl. No.: 10/002,986

(22) Filed: Nov. 30, 2001

(65) Prior Publication Data

US 2003/0104319 A1   Jun. 5, 2003

(51) Int. Cl.
G03F 9/00 (2006.01)
G03F 7/26 (2006.01)

(52) U.S. Cl. ............... 430/5; 22/312; 22/394; 22/396

(58) Field of Classification Search ........ 430/394, 430/5, 312–315, 22, 396
See application file for complete search history.

(56) References Cited

U.S. PATENT DOCUMENTS

| | | | |
|---|---|---|---|
| 5,308,741 A | 5/1994 | Kemp | 430/312 |
| 5,424,154 A * | 6/1995 | Borodovsky | 430/5 |
| 5,573,634 A | 11/1996 | Ham | 156/659.11 |
| 5,595,843 A * | 1/1997 | Dao | 430/5 |
| 5,795,686 A | 8/1998 | Takizawa et al. | 430/5 |
| 5,897,975 A | 4/1999 | Ahn et al. | 430/5 |
| 6,015,650 A * | 1/2000 | Bae | 430/314 |
| 6,218,057 B1 | 4/2001 | Cirelli et al. | 430/5 |
| 6,238,850 B1 | 5/2001 | Bula et al. | 430/394 |
| 6,277,543 B1 * | 8/2001 | Furukawa et al. | 430/311 |
| 6,337,175 B1 * | 1/2002 | Yamaguchi | 430/322 |
| 6,368,754 B1 * | 4/2002 | Imai | 430/5 |
| 6,514,648 B2 * | 2/2003 | Peng | 430/30 |
| 2002/0106588 A1 * | 8/2002 | Lai et al. | 430/322 |

* cited by examiner

Primary Examiner—Kathleen Duda
(74) Attorney, Agent, or Firm—Thomas, Kayden, Horstemeyer & Risley

(57) ABSTRACT

A new method is provided for the creation of contact holes. The invention provides two masks. The first mask, referred to as the packed mask, comprises the desired contact holes, which are part of the creation of a semiconductor device. To the packed mask are added padding holes in order to increase the hole density of the packed mask. The second mask, referred to an the unpacking mask, comprises openings at the same locations as the locations of the padding holes of the first mask, the openings provided in the second mask have slightly larger dimensions than the padding holes of the first mask. A first exposure is made using the packed mask, a second exposure of the same surface area is made using the unpacking mask. The unpacking mask is used to selectively cover the padding contact holes, resulting in the final image. Two types of unpacking masks can be used, a first type having unpacking holes that surround the desired hole pattern, a second type having unpacking holes that align with the desired hole pattern.

69 Claims, 10 Drawing Sheets

CONTACT HOLE PRINTING BY PACKING AND UNPACKING

BACKGROUND OF THE INVENTION (1) Field of the Invention

The invention relates to the fabrication of integrated circuit devices, and more particularly, to a method of improved contact hole creation for ultra-small contact holes.

(2) Description of the Prior Art

Integrated semiconductor devices comprise electronic circuits of sub-micron and deep sub-micron dimensions and are typically created in or on the surface of a silicon substrate. The creation of semiconductor devices is supported by sophisticated and interacting, mutually supporting disciplines.

Device features are transposed from a mask onto a semiconductor surface using photolithographic imaging processes. Since this exposure depends on the transfer of photo energy from a source to a target surface, it is to be expected that, for target features that are created in very close proximity to each other, the transfer of photo energy interacts for very closely spaced device features, most commonly interconnect lines or contact holes having sub-micron spacing between adjacent lines.

A common measure for the occurrence of such interaction are applications where the Critical Dimensions (CD) of the layout of the Integrated Circuit (IC) approach the resolution limit of the lithography equipment. For such applications, proximity effects begin to influence the manner in which mask images are transferred to target surfaces. This interaction imposes limitations on the proximity of adjacent device features, these limitations are referred to as Critical Dimensions (CD) of a design and device layout.

The invention addresses problems and limitations that are encountered when creating openings on a semiconductor surface such as the surface of a layer of photoresist or the surface of a semiconductor substrate.

U.S. Pat. No. 5,573,634 (Ham) shows a double exposure contact hole method.

U.S. Pat. No. 6,218,057 (Cirelli et al.) shows a lithographic process for contact holes using 2 masks/exposures.

U.S. Pat. No. 6,238,850 (Bula et al.) shows a photo method for contact holes using 2 masks/exposures.

U.S. Pat. No. 5,308,741 (Kemp), U.S. Pat. No. 5,897,975 (Ahn et al.) and U.S. Pat. No. 5,795,686 (Takizawa et al.) are related photo methods.

SUMMARY OF THE INVENTION

A principle objective of the invention is to provide a method of creating contact holes of sub-micron dimensions whereby the provided method is not limited to holes of one hole-diameter to hole-distance ratio.

Another objective of the invention is to provide a method of creating contact holes of sub-micron dimensions whereby the range of the ratio of hole-diameter to hole-distance is narrowed to an optimum range of off axis illumination.

Another objective of the invention is to provide a method of creating contact holes using a packing and unpacking procedure.

Another objective of the invention is to provide improved Depth Of Focus (DOF) during the creation of contact holes.

Yet another objective of the invention is to improve a Mask Error Factor (MEF) associated with the creation of contact holes.

In accordance with the objectives of the invention a new method is provided for the creation of contact holes. The invention provides two masks. The first mask, referred to as the packed mask, comprises the desired contact holes, which are part of the creation of a semiconductor device. To the packed mask are added padding holes in order to increase and condense the hole density of the packed mask. The second mask, referred to as the unpacking mask, comprises openings at the same locations as the locations of the padding holes of the first mask, the openings provided in the second mask have slightly larger dimensions than the padding holes of the first mask. A first exposure is made using the packed mask, a second exposure of the same surface area is made using the unpacking mask. The unpacking mask is used to selectively cover the padding contact holes, resulting in the final image. Two types of unpacking masks can be used, a first type having unpacking holes that surround the desired hole pattern, a second type having unpacking holes that align with the desired hole pattern.

DESCRIPTION OF THE PREFERRED EMBODIMENTS

The invention addresses the problems that are typically caused in imaging contact holes. In past practices, these problems have been addressed by off-axis illumination in the form of annular, quadruple of dipole configurations. This method however is highly dependent on the density of the created images and can be optimized for only one density of images at the time. The invention provides a method of creating contact holes that improves Depth Of Focus (DOF) and a Mask Error Factor (MEF) for the creation of the contact holes. The invention purposely packs the holes up in order to reduce the spread of pitches and to take advantage of the improvement of off-axis illumination to closely packed and equally pitched features Proximity effects have to be corrected but are effectively irrelevant to the invention.

In applying conventional micro-photolithography with a reduction of the feature size below 0.4 lambda/NA, where lambda is the actinic wavelength and NA is the numerical aperture of the imaging lens, the depth of focus (DOF) is in the order of 0.21 lambda/NHA, where NHA is the numerical half aperture. To create 0.1 µm contact holes, using a wavelength of 193 nm and a NA of 0.65, the feature size is 0.34 lambda/NA and the DOF is about 0.32 µm. In addition, the Mask Error Factor (MEF), which is defined as the ratio between the incremental change of the image dimension and the incremental change of the object dimension on the mask, is in the order of 4.0. Both indicated values of DOF and MEF are unacceptable for the creation of contact holes for sub-micron and deep-sub-micron semiconductor devices. The invention provides a method for the improvement of both DOF and MEF for such contact holes.

Methods have been provided to improve the DOF of closely packed contact holes with off-axis illumination. This off-axis illumination can be applied in annular, quadruple or bipolar configurations but the location of these configurations can be optimized only for a specific packing density. For example, only the image of holes with a hole-diameter to hole-separation ratio of 1:1 is optimized. After this optimization has been implemented for the 1:1 ratio, holes with a ratio of 1:2 benefit to a lesser extent than the 1:1 ratio holes. This decrease in benefit is even more pronounced for holes that are further separated, such as isolated holes. Alternately, holes may be optimized for a hole-diameter to hole-separation ratio of 1:2, with worsened results for holes that are packed closer and holes that are packed less tightly than the optimized holes.

The invention addresses the above stated concerns by providing two masks. The first mask, referred to as the packed mask, comprises the desired contact holes, which are part of the creation of a semiconductor device. To the packed mask are added padding holes in order to increase the hole density of the packed mask and to reduce the range of hole pitches. The second mask, referred to an the unpacking mask, comprises openings at the same locations as the locations of the padding holes of the first mask, the openings provided in the second mask have slightly larger dimensions than the padding holes of the first mask. A first exposure is made using the packed mask, a second exposure of the same surface area is made using the unpacking mask. The unpacking mask is used to selectively cover the padding contact holes, resulting in the final image. Two types of unpacking masks can be used, a first type having unpacking holes that surround the desired hole pattern, a second type having unpacking holes that align with the desired hole pattern.

To formalize and further expand the above stated procedures of the invention, these procedures can be stated as follow:

- the invention provides a first mask, images of the desired holes and of padding holes are provided in the first mask
- the invention provides a second mask, unpacking images are provided in the second mask, the unpacking images align with the padding images; the images that are provided in the second mask are slightly larger than the corresponding images of the padding holes of the first mask
- the first and the second mask can be implemented by making the mask background surface (which surrounds the therein created images) opaque, the therein created images being transparent
- the first and the second mask can be implemented by making the mask background surface (which surrounds the therein created images) transparent, the therein created images being opaque
- the application of the first and the second mask can be further extended, using a first layer of photoresist, in which a pattern of holes is created using the two masks of the invention, and hardening or cross-linking the layer of photoresist; this pattern of holes can then further be extended by the deposition of a second layer of photoresist of the surface of the patterned first layer of photoresist, the second layer of photoresist is in turn patterned and developed
- positive and negative photoresist can be used
- a dual-polarity layer of photoresist can be used
- a layer of insulation can be used for the creation of a pattern of holes using the two masks of the invention; all processes of exposure that have been highlighted above for a layer of photoresist can equally be applied to a layer of insulation, thereby including the deposition and patterning and etching of a second layer of insulation
- special arrangements can be made relating to spacing the holes that are created, and
- special arrangements can be made relating to providing extra holes surrounding the holes that are created, the diameter of these extra holes can be adjusted with respect to the diameter of the holes that are created.

The invention will now be further explained using FIGS. 1a through 7c. For these explanations, the following must be kept in mind. Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered soluble (positive working) and form the pattern, or insoluble (negative working) and be washed away.

Figure 1A:
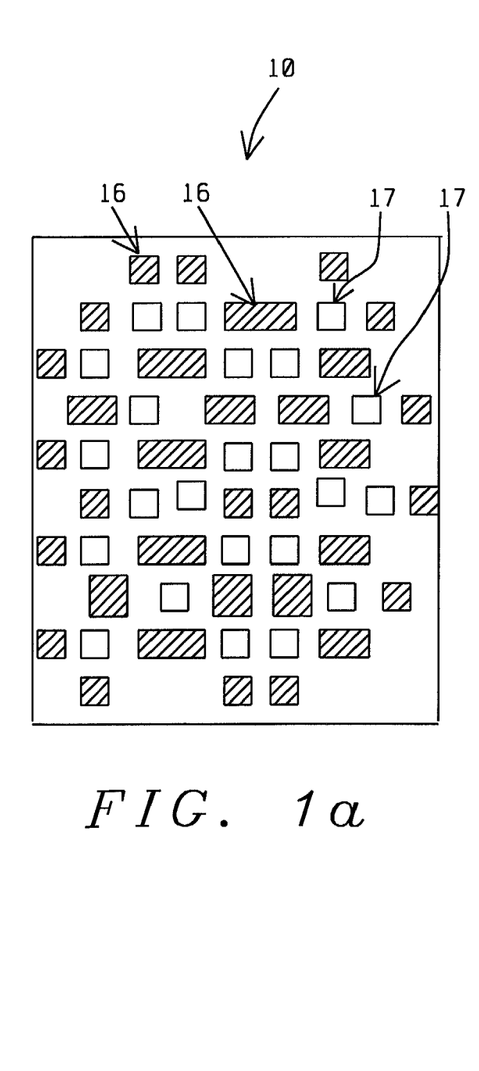
FIGS. 1a through 1c show a top view of a pack-and-cover scheme that is based on padding holes.
Figure 1B:
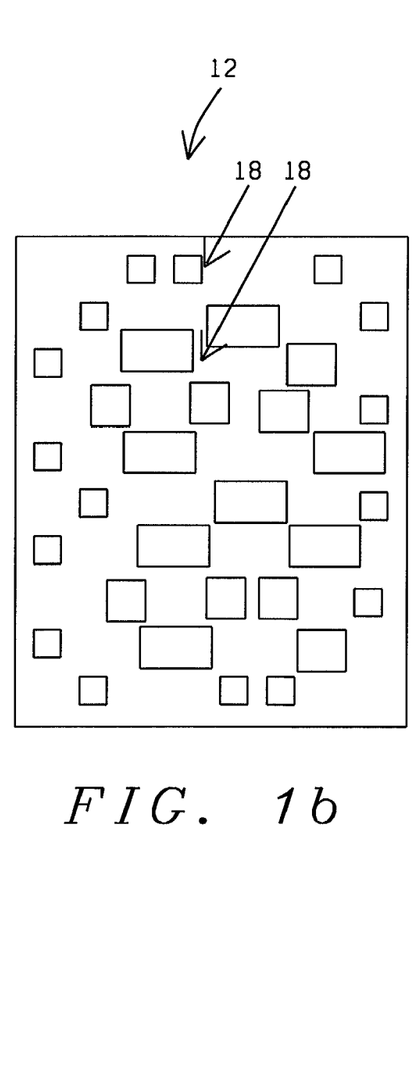
Figure 1C:
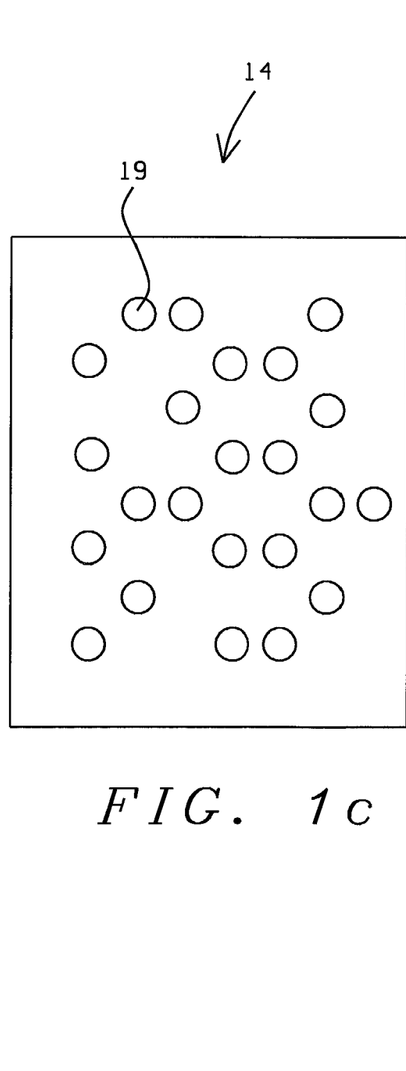

FIG. 1a through 1c show the application of the packed and the unpacking mask where the unpacking features provided in the unpacking mask align with the padding holes in the packed mask.

Referring now specifically to FIGS. 1a through 1c, there is shown:

- 10, FIG. 1a, a top view of the packed mask
- 12, FIG. 1b, a top view of the unpacking mask
- 14, FIG. 1c, a top view of the final image
- 16, a top view of padding holes contained in the packed mask 10
- 17, a top view of desired holes contained in the packed mask 10
- 18, a top view of the unpacking features contained in the unpacking mask 12; it must be noted that the unpacking features 18 in unpacking mask 12 are in the same relative positions (align with) within the mask 12 as the padding holes 16 in the packed mask 10; it must further be noted that the unpacking features 18 have slightly larger dimensions than padding holes 16, and
- 19, a top view of the final images of the desired holes.

Figure 2A:
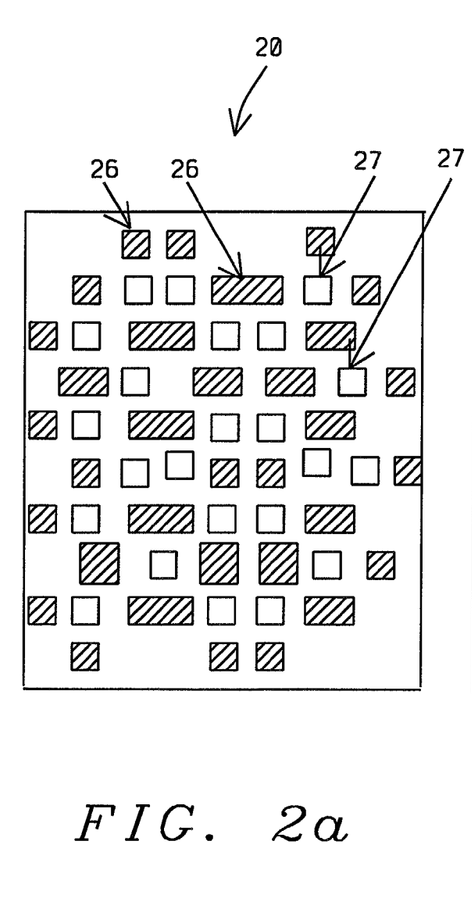
FIGS. 2a through 2c show a top view of a pack-and-cover scheme that is based on the desired holes.
Figure 2B:
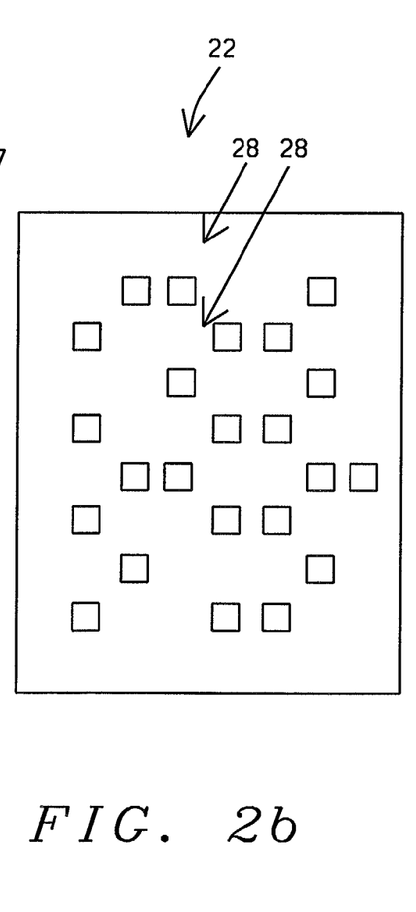
Figure 2C:
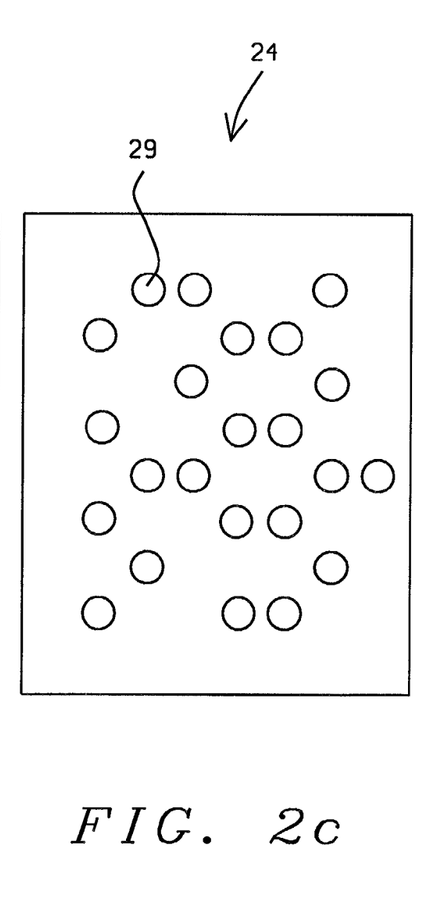

FIGS. 2a through 2c show the application of the packed and the unpacking mask where the unpacking features provided in the unpacking mask align with the desired holes in the packed mask. Referring specifically to FIGS. 2a through 2c, there is shown:

20, FIG. 2a, a top view of the packed mask

22, FIG. 2b, a top view of the unpacking mask

24, FIG. 2c, a top view of the final image 26, a top view of padding holes contained in the packed mask 20

27, a top view of desired holes contained in the packed mask 20

28, a top view of the unpacking features contained in the unpacking mask 22; it must be noted that the unpacking features 28 in unpacking mask 22 are in the same relative positions (align with) within the mask 28 as the desired holes 27 in the packed mask 20; it must further be noted that the unpacking features 28 are slightly larger dimensions than the desired holes 27, and 29, a top view of the final images of the desired holes.

FIGS. 3 through 6 show cross sections of implementations of the masks of the invention.

Figure 3A:
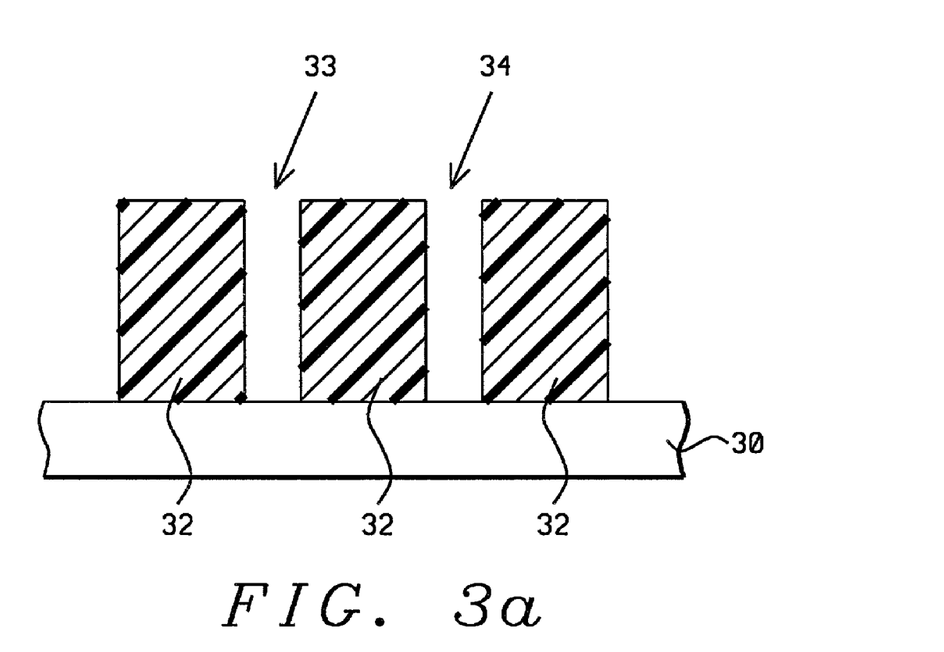
FIGS. 3a through 3d show a cross section of two layers of photoresist to which hole printing have been applied using the Packing And Unpacking (PAU) method of the invention.

Shown in cross section in FIGS. 3a through 3d are:

30, FIG. 3a, a semiconductor surface over which a pattern of holes (desired holes) is to be created; this semiconductor surface typically is the surface of a monocrystalline silicon substrate 32, a first layer of photoresist, coated over surface 30

Figure 3B:
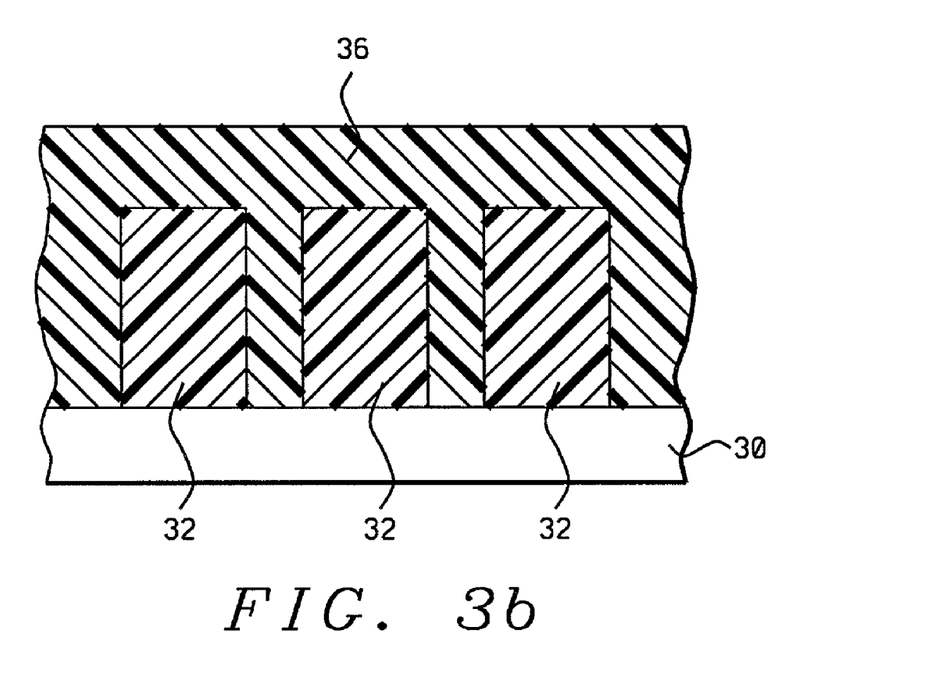
Figure 3C:
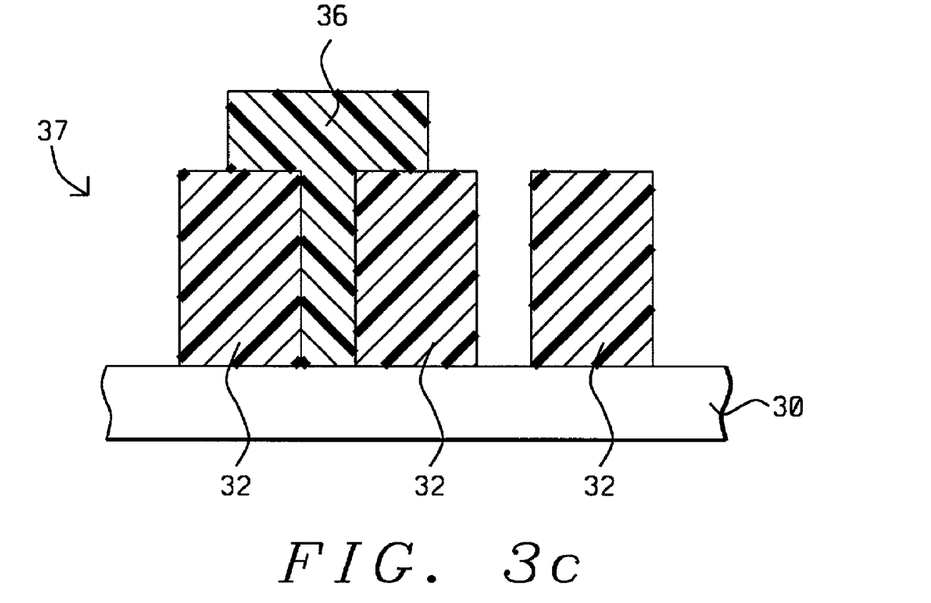
Figure 3D:
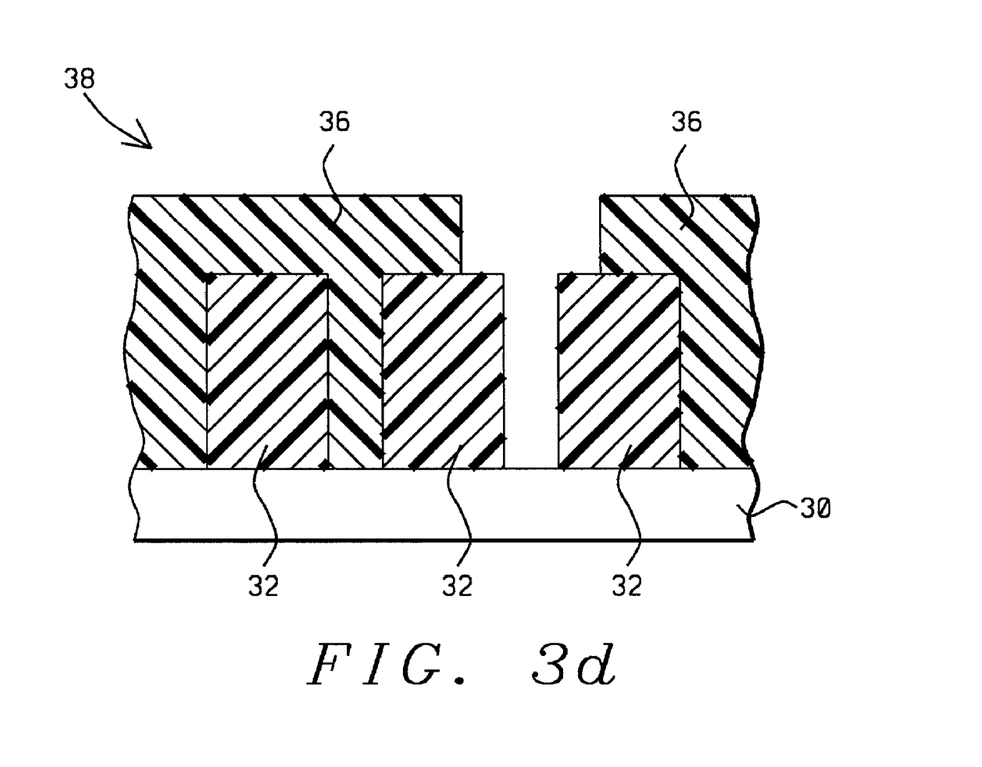

33, a padded hole created through the first layer 32 of photoresist 34, a desired hole created through the first layer 32 of photoresist 36, FIG. 3b, a second layer of photoresist, coated over surface of the patterned first layer 32 of photoresist, including openings 33 and 34 created in the first layer 32 of photoresist 37, FIG. 3c, a first cross section that shows unpacking results, resulting in filling padded hole 33, and 38, FIG. 3d, a second cross section that shows unpacking results, resulting in filling padded hole 33 and in filling the background.

It is of value at this time to correlate the three cross sections that are shown in FIGS. 3a through 3c with the processing steps that are required to create these cross sections. The sequences of FIGS. 3a, 3b and 3c and of FIGS. 3a, 3b and 3d relate to the masks as shown in FIGS. 1a through 1c as follows:

FIG. 3a shows a cross section after exposure and development of the first layer 32 of photoresist with a mask comprising desired contact holes and dummy padding contact holes, that is mask 10 of FIG. 1a.

FIG. 3c shows a cross section after exposure and development of the second layer 36 of photoresist with a mask 12, FIG. 1b, comprising unpacking features, with the unpacking features being opaque and the mask background being transparent, not exposing the padded holes (since the unpacking features align with the padded holes), using positive photoresist for layer 36 so that the exposed surface of the layer 36 is soluble and is washed away after exposure, the layer 36 of photoresist remains in place overlying the padded hole, with the remaining layer 36 of photoresist being slightly larger than the padded hole 33.

FIG. 3d shows a cross section after exposure and development of the second layer 36 of photoresist with a mask comprising unpacking features with the unpacking features being transparent and the mask background being opaque, exposing the padded holes (since the unpacking features align with the padded holes), using positive photoresist for layer 36 so that the exposed surface of the layer 36 is soluble and is washed away after exposure, the layer 36 of photoresist remains in place overlying the padded hole.

Figure 4A:
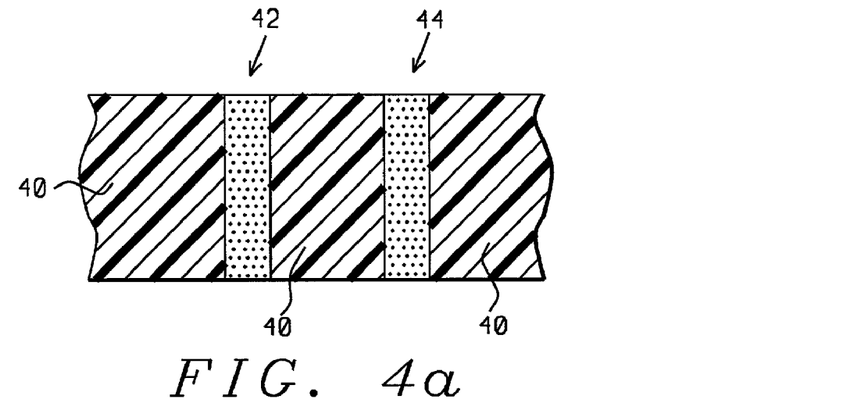
FIGS. 4a through 4c show a cross section of one layer of photoresist to which hole printing is applied using the Packing And Unpacking (PAU) method of the invention, the layer of photoresist comprises a layer of dual-polarity photoresist.
Figure 4B:
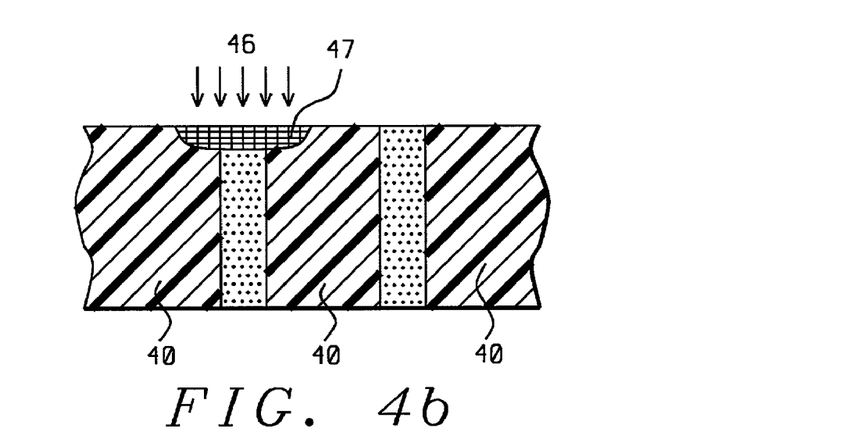
Figure 4C:
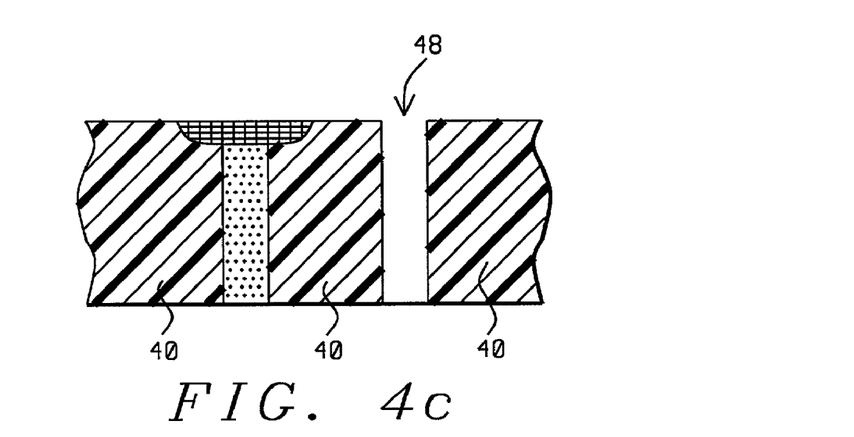

FIGS. 4a through 4c show a cross-section of a layer of photoresist whereby dual-polarity photoresist is used, as follows:

40, FIG. 4a, the cross section of a dual-polarity layer of photoresist 42, the location of the padded hole 44, the location of the desired hole 46, FIG. 4b, a cross-link exposure of the surface of layer 40, aligned with the location of the padded hole, in effect "sealing" the padded hole 42 and preventing further development of the padded hole 42

47, the surface region of layer 40 where the dual-polarity layer 40 of photoresist has been cross-linked FIG. 4c, the cross section of layer 40 after this layer has been developed, creating the desired opening 48 through the layer 40 of dual-polarity photoresist.

Figure 5A:
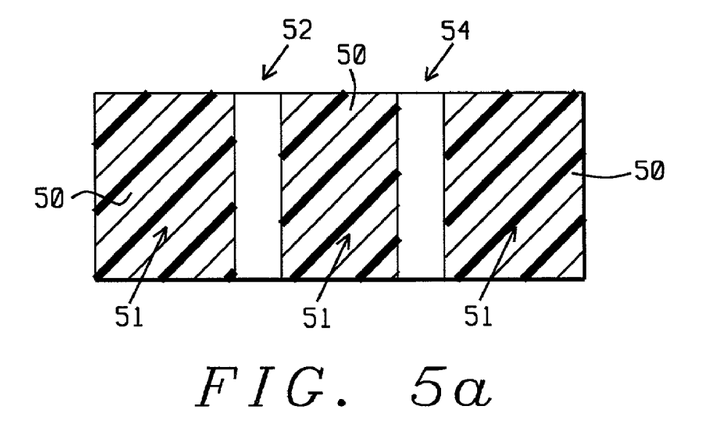
FIGS. 5a through 5c show a cross section of one layer of photoresist to which hole printing is applied using the Packing And Unpacking (PAU) method of the inventions the layer of photoresist comprises a layer of negative photoresist.
Figure 5B:
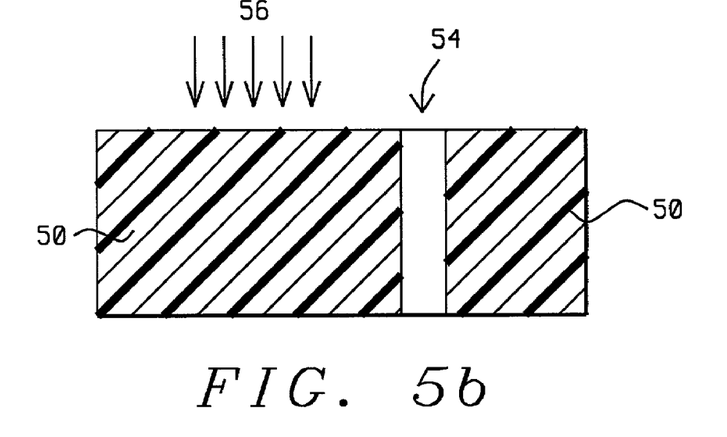
Figure 5C:
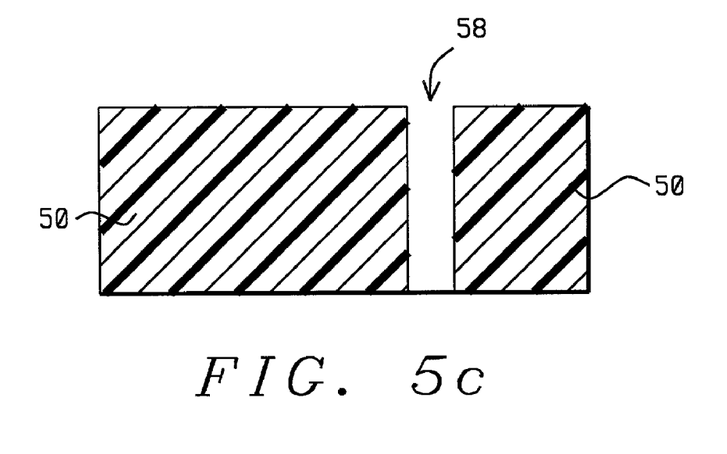

FIGS. 5a through 5c show a cross-section of a layer of photoresist whereby negative photoresist is used, as follows:

50, the cross section of a negative layer of photoresist 52, the location of the padded hole 54, the location of the desired hole; the padded hole 52 and the desired hole 54 are at this time surrounded by latent image 51 created in the layer 50 of negative photoresist, having been created by a first exposure of the surface of layer 50 of negative photoresist 56, a second exposure of the surface of layer 50, aligned with the location of the padded hole, in effect "sealing" the padded hole 42 and preventing further development of the padded hole 42; exposure 56 comprises an exposure of hardening the surface of layer 50 of photoresist, and 58, the cross section of layer 50 after this layer has been developed, creating the desired hole 58 through the layer 50 of negative photoresist.

Figure 6A:
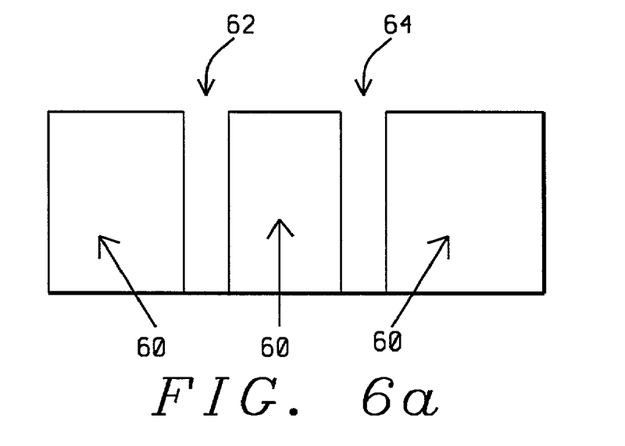
FIGS. 6a through 6c show a cross section of a first layer of insulation to which hole printing has been applied using the Packing And Unpacking (PAU) method of the invention, a second layer of insulation has been deposited over the created hole pattern.
Figure 6B:
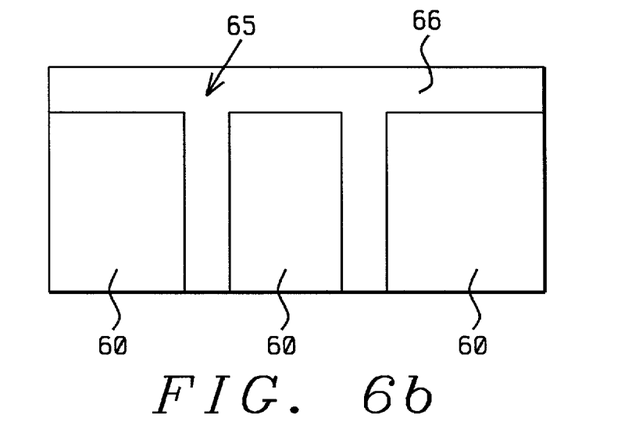
Figure 6C:
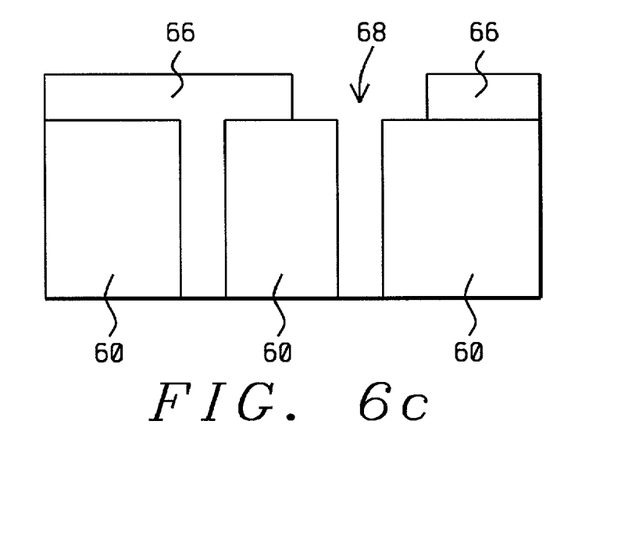

FIGS. 6a through 6c show a cross section of one layer of insulation to which hole printing using the Packing And Unpacking (PAU) of the invention have been applied, as follows:

60, the cross section of a first layer of insulation 62, the location of the padded hole 64, the location of the desired hole 66, the second layer of insulation, deposited over the surface of the first layer 60 of insulation, including the padded hole 62 and the desired hole 64

68, the opening created through the first and the second layer of insulation after the second layer of insulation has been removed in accordance with the pattern of the desired hole.

Figure 7A:
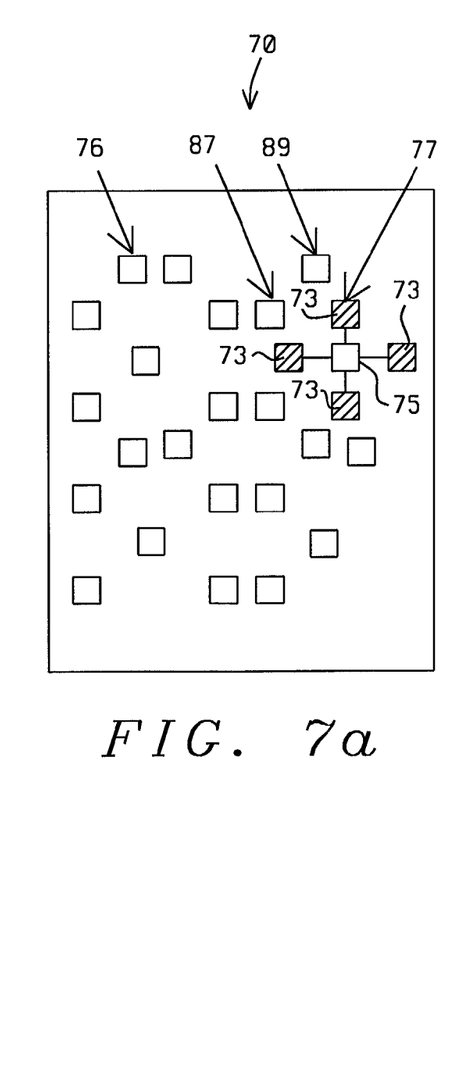
FIGS. 7a through 7c show a top view of desired holes, the padding holes that are added and the resulting, combined hole pattern.
Figure 7B:
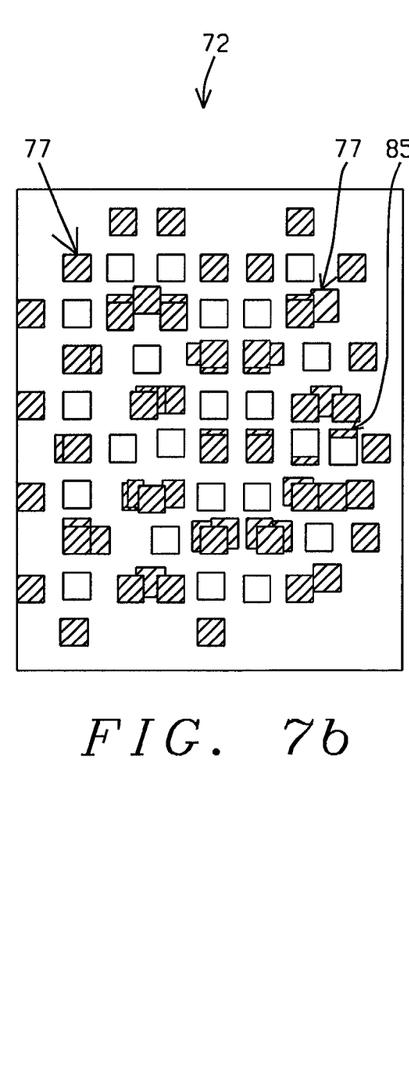
Figure 7C:
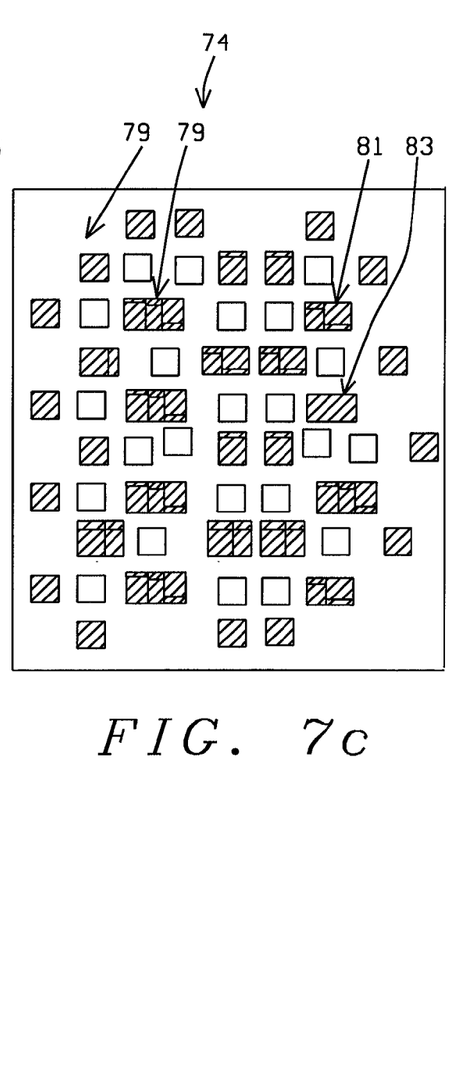

FIGS. 7a through 7c show a sequence of mask layouts that follows the process of creation from an original layout to packed mask layout, as follows:

70, FIG. 7a, the desired hole pattern provided on the surface of a mask

72, FIG. 7b, a pattern of padded holes that is added to the desired hole pattern 70

74, FIG. 7c, a mask of the combined desired holes and the padding holes 76, the desired holes provided in the mask 70

77, the padding hole provided in the mask 72

71, one of the desired holes that has been selected as an example, four padding holes 73 have been added to the desired hole 71

75, the distance between the desired hole 71 and the four surrounding padding holes 73; it must be noted that the pattern that is created by the four padding holes 73 is applied to each of the desired holes 76, this is shown in the view 72

79, an example of combined padding holes; by comparing the view 72 with the view 74, it is clear that added padding holes that overlap or that essentially overlap are combined into one padding hole, such as for instance padding holes 81 and 83.

Further explanations that relate to the highlighted drawings are provided next in order to further explain the invention.

FIGS. 3a through 3c show the two-resist coating process to perform PAU. The first layer of photoresist is exposed with the packed mask and developed as usual. A compatible second layer of photoresist is coated on the delineated image in the first layer of photoresist image without affecting it. For some second layers of photoresist, in order to preserve the first photoresist image, hardening and/or cross-linking of the image in the first layer of photoresist is desirable. A dependable method to obtain a stable image of the first layer of photoresist is the use of a bi-layer resist system. The bottom layer of a bi-layer resist system is first cross-linked. Then, an imaging layer is coated over the first layer. In most cases, the imaging layer contains an element that forms a non-volatile compound such as silicon. The bi-layer is subsequently delineated with etch and serves as the first layer of resist image. Either positive or negative photoresist may be used for the second layer of photoresist.

Figure 8A:
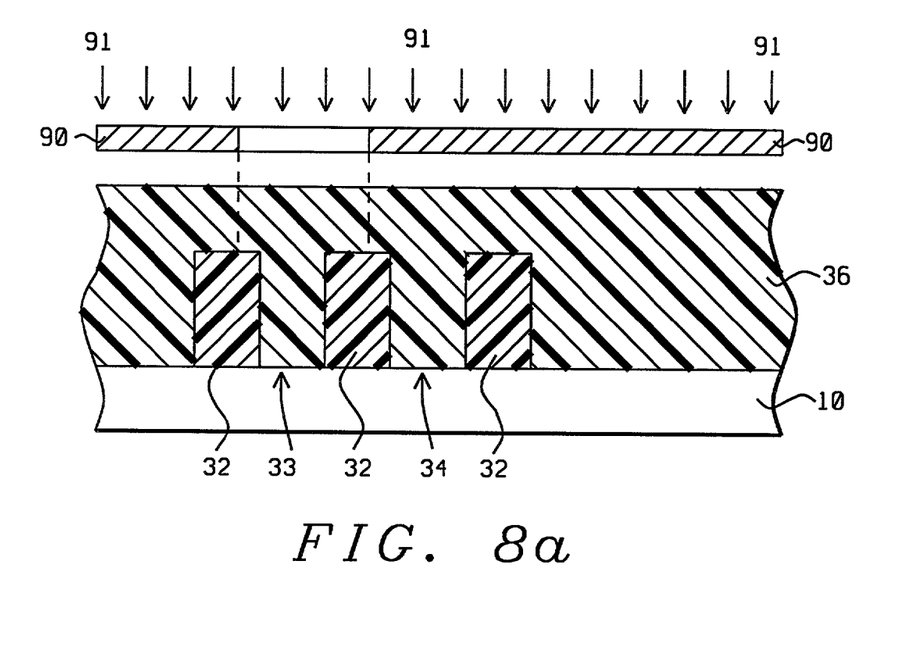
FIGS. 8a through 8d show combinations of mask patterns and layers of photoresist.

When a negative resist is chosen, a dark-field unpacking mask, which is based on the padded holes (mask 12, FIG. 1b, with unpacking features 18 being transparent and the background of the mask that surrounds the unpacking features 18 being opaque), exposes the second layer of photoresist at the padded holes to make the padded holes insoluble in the resist developer, resulting in coverage of the padded holes (see also FIG. 8a for additional details). Alternately, a light-field unpacking mask, which is based on the desired holes (mask 22, FIG. 2b, with unpacking features 28 being opaque and the background of the mask that surrounds the unpacking features 28 being transparent), exposes the negative second layer of photoresist in all areas except where the desired holes are located and results in coverage of the background (see also FIG. 8d for additional details). When a positive photoresist is chosen for the second layer of photoresist, a light-field unpacking mask, which is based on the padding holes (mask 12, FIG. 1b, with unpacking features 18 being opaque and the background of the mask that surrounds the unpacking features 18 being transparent), results in coverage of the padded holes (see also FIG. 8b for additional details) while a dark-field unpacking mask (mask 22, FIG. 2b, with unpacking features 28 being transparent and the background of the mask that surrounds the unpacking features 28 being opaque), which is based on the desired holes, results in coverage of the background (see also FIG. 8c for additional details).

PAU can be applied using a single layer of photoresist, PAU is not limited to using 2 resist coatings. Two examples are shown in FIGS. 4a through 4c and 5a through 5c respectively. FIGS. 4a through 4c show the PAU process with a single layer of dual-polarity resist. The dual polarity resist exhibits positive resist characteristics with normal exposure. It behaves like a negative resist with a higher energy exposure or dosage. Hence, one exposes the packed mask normally. Then the unpacking mask is exposed with a higher energy or dosage. Only the surface of this resist needs to be made insoluble by the second exposure. After development, only the desired contact holes are delineated. The unpacked mask may be a dark-field mask based on the padding holes or a light-field mask based on the desired holes.

Yet another PAU method can be practiced as shown in FIGS. 5a through 5c. A single layer of negative photoresist is exposed with a light-field packed mask (FIG. 5a), followed with a second exposure with a dark-field mask based on the padding holes or a light-field mask based on the desired holes (FIG. 5b). The area of the padding holes and desired holes is unexposed after the first exposure. The second exposure exposes the padding holes to render them insoluble in the developer, resulting in a simple contact-hole image as shown.

PAU can also be applied directly to an insulating film where the contact holes are to be opened. Another means to practice PAU is to go through the normal contact hole delineation process using the packed mask from steps of exposure, development through etching. Now, both the desired and the padding holes are opened in an insulating layer of the integrated circuit. Only the desired holes can remain open for the final circuit. The padding holes therefore have to be filled up with insulators. FIGS. 6a through 6c show the deposition of a subsequent insulating layer on the delineated insulating layer. The second insulating layer has a different material than the material of the first insulating layer and can be differentially removed from the latter. The deposition can use any of the known methods such as chemical vapor deposition, sputter, or spin coating. Another masking layer using a typical resist and the unpacking mask selectively removes the second insulating material from the desired contact hole area. A photo sensitive insulating layer can be used for the second insulating layer. This way, the second insulating layer can simply be exposed with the unpacking mask and developed in order to selectively remove the areas at the desired holes.

One method to add the padding holes is shown in FIGS. 7a through 7c. Four padding holes 73, which are similar in size with the desired hole 71, are placed at the four sides of 71 as shown in FIG. 7a. They are separated from 71 by a distance 75. FIG. 7a is a plot of the desired holes with the exception of the four padding holes 73 for illustration purpose. The process of adding four holes to one desired hole continues until all desired holes are treated as shown in FIG. 7b. Notice that the padding holes may overlap each other irregularity as in cluster 77 or they may overlap a desired hole as in cluster. Cluster 77 is actually constituted from the padding holes to desired holes 71, 87 and 89. For cluster 77, a rectangle enclosing all three overlapping padding holes is drawn and replaces the three padding holes as shown in FIG. 7c. For cluster 85, the padding holes are simply omitted.

The invention, in view of the number of independent parameters that can be selected in the creation of the desired openings, involves a somewhat complex thought process that can perhaps best be focused by a set of drawings, for this reason drawings FIGS. 8a through 8d are provided.

In viewing these drawings, the following must be realized:

the pattern that is created in the first layer of photoresist, see FIG. 3a, is a base pattern that applies to all of these drawings a second layer of photoresist is deposited over the base pattern, see layer 36, FIG. 3b; this second layer of photoresist is patterned, creating an opening in this layer of photoresist that in all cases and by definition must align with the desired opening, that is opening 34, FIG. 3a.

Using mask 12, FIG. 1a, where the unpacking features do not align with the desired holes but align with the padding holes, the second layer of photoresist will only be removed from the desired holes under one of two conditions:

1. the second layer of photoresist is a negative layer of photoresist and the unpacking mask exposes (exposure 91) the padding holes, that is the unpacking features of the unpacking mask are transparent and the surrounding background surface of the unpacking mask is opaque; see FIG. 8a where layer 36 is a negative (second) layer of photoresist, mask 90 has an opening that aligns with the padding holes and does not align with the desired hole 34

Figure 8B:
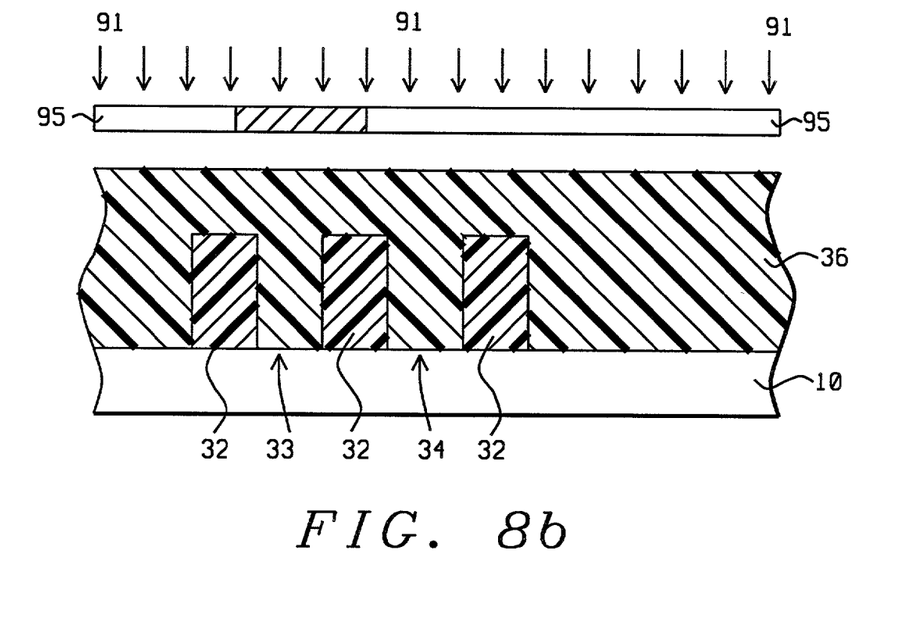

2. the second layer of photoresist is a positive layer of photoresist and the unpacking mask does not expose the padding holes, that is the unpacking features of the unpacking mask are opaque and the surrounding background surface of the unpacking mask is transparent; see FIG. 8b where layer 36 is a positive (second) layer of photoresist, mask 92 is opaque in a surface area of the mask 92 that aligns with the padding holes and does not align with the desired hole 34.

The above two conditions can be summarized as follows, using the same sequence of conditions as followed above:

1. a packed mask is used for creating closely spaced contact holes, creating a first pattern of contact holes (holes 34, FIG. 8a) and a second pattern of contact holes (holes 33, FIG. 8a). A mask 90, FIG. 8a, is used comprising a pattern of contact holes, the pattern of holes in the mask 90 is aligned with the second pattern of holes 33, FIG. 8a, the pattern of holes in mask 90 comprising a transparent pattern of holes with a surrounding opaque background surface 2. a packed mask is used for creating closely spaced contact holes, comprising a first pattern of contact holes (holes 34, FIG. 8b) and a second pattern of contact holes (holes 33, FIG. 8b). A mask 95, FIG. 8b, is used comprising a pattern of holes, said pattern of holes in mask 95 being aligned with said second pattern of holes 33, said pattern of holes in mask 95 being an opaque pattern of holes with a surrounding transparent background surface.

Figure 8C:
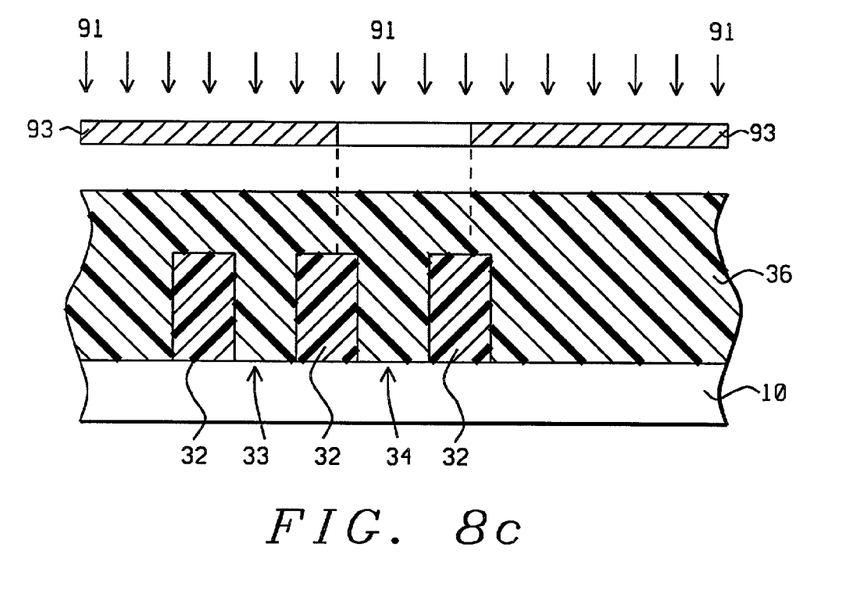

Using mask 12, FIG. 1b, where the unpacking features align with the desired holes and do not align with the padding holes, the second layer of photoresist will only be removed from the desired holes under one of two conditions:

1. the second layer of photoresist is a positive layer of photoresist and the unpacking mask exposes the desired holes, that is the unpacking features of the unpacking mask are transparent and the surrounding background surface of the unpacking mask is opaque; see FIG. 8c where layer 36 is a positive (second) layer of photoresist, mask 93 has an opening that aligns with the desired hole 34

Figure 8D:
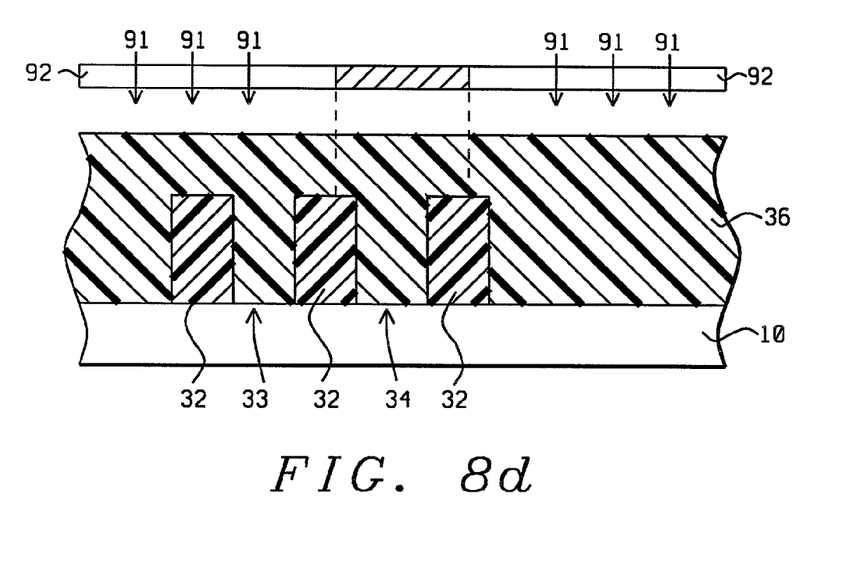

2. the second layer of photoresist is a negative layer of photoresist and the unpacking does not expose the desired holes, that is the unpacking features of the unpacking mask are opaque and the surrounding background surface of the unpacking mask is transparent; see FIG. 8d where layer 36 is a negative (second) layer of photoresist, mask 92 is transparent in a surface area of the mask 93 that does not align with the desired hole 34.

The above two conditions can be summarized as follows, using the same sequence of conditions as followed above:

1. a packing and unpacking mask is used for creating closely spaced contact holes, comprising a first pattern of contact holes 34, FIG. 8c, and a second pattern of contact holes 33, FIG. 8c. A mask 93, FIG. 8c, is used comprising a pattern of holes, the pattern of holes in mask 93 being aligned with the first pattern of holes 34, the pattern of holes in mask 93 being a transparent pattern of holes with a surrounding opaque background surface 2. a packing and unpacking mask is used for creating closely spaced contact holes, comprising a first pattern of contact holes 34, FIG. 8d, and a second pattern of contact holes 33, FIG. 8d. A mask 92, FIG. 8d, is used comprising a pattern of holes, said pattern of holes in mask 93 being aligned with said first pattern of holes 34, FIG. 8d, said pattern of holes in mask 92 being an opaque pattern of holes with a surrounding transparent background surface.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating closely spaced contact holes, comprising:
   (1) providing a substrate, said substrate having been provided with a first layer of material for creation of a pattern of contact holes;
   (2) exposing said first layer of material with a first mask, said first mask comprising a first and a second pattern of contact holes having a first and second critical dimension, said first and second pattern being interspersed;
   (3) creating openings in said first layer of material in accordance with said first and second pattern of contact holes;
   (4) depositing a second layer of material over said first layer of material, including said openings created in said first layer of material in accordance with said first and second pattern of holes;
   (5) exposing said second layer of material with a mask selected from the group consisting of:
   (i) a second mask comprising a third pattern of holes having a third critical dimension, said third pattern of holes being aligned with said second pattern of holes, said third pattern of holes being a transparent pattern of holes with a surrounding opaque background surface, said third critical dimension comprising a range of critical dimensions being equal to or larger than said second critical dimension;
   (ii) a third mask comprising a third pattern of holes having a third critical dimension, said third pattern of holes being aligned with said second pattern of holes, said third pattern of holes being an opaque pattern of holes with a surrounding transparent background surface, said third critical dimension comprising a range of critical dimensions being equal to or larger than said second critical dimension;
   (iii) a fourth mask comprising a fourth pattern of holes having a fourth critical dimension, said fourth pattern of holes being aligned with said first pattern of holes, said fourth pattern of holes being a transparent pattern of holes with a surrounding opaque background surface, said fourth critical dimension comprising a range of critical dimensions being equal to or larger than said first critical dimension;
   (iv) a fifth mask comprising a fourth pattern of holes having a fourth critical dimension, said fourth pattern of holes being aligned with said first pattern of holes, said fourth pattern of holes being an opaque pattern of holes with a surrounding transparent background surface, said fourth critical dimension comprising a range of critical dimensions being equal to or larger than said first critical dimension; and (6) creating openings in said second layer of material in accordance with said third or fourth pattern of holes.

2. The method of claim 1, said first pattern of holes comprising contact holes.

3. The method of claim 1, said second pattern of holes comprising dummy holes.

4. The method of claim 1, wherein said creating openings in said second layer of material in accordance with said third or fourth pattern of holes comprises:
   selecting a negative photoresist for said second layer of material;
   providing said second mask;
      aligning said third pattern of holes provided in said second mask with said second pattern of holes created in said first layer of material;
      exposing said second layer of material in accordance with said third pattern of holes provided in said second mask; and
      developing said second layer of material in accordance with said third pattern of holes provided in said second mask.

5. The method of claim 1, wherein said creating openings in said second layer of material in accordance with said third or fourth pattern of holes comprises:
   selecting a positive photoresist for said second layer of material;
   providing said third mask;
   aligning said third pattern of holes provided in said third mask with said second pattern of holes created in said first layer of material;
   exposing said second layer of material in accordance with said third pattern of holes provided in said second mask; and
   developing said second layer of material in accordance with said third pattern of holes provided in said second mask.

6. The method of claim 1, wherein said creating openings in said second layer of material in accordance with said third or fourth pattern of holes comprises:
   selecting a positive photoresist for said second layer of material;
   providing said fourth mask;
   aligning said fourth pattern of holes provided in said fourth mask with said second pattern of holes created in said first layer of material;
   exposing said second layer of material in accordance with said fourth pattern of holes provided in said fourth mask; and
   developing said second layer of material in accordance with said fourth pattern of holes provided in said fourth mask.

7. The method of claim 1, wherein said creating openings in said second layer of material in accordance with said third or fourth pattern of holes comprises:
   selecting a negative photoresist for said second layer of material;
   providing said fifth mask;
   aligning said fourth pattern of holes provided in said fifth mask with said second pattern of holes created in said first layer of material;
   exposing said second layer of material in accordance with said fourth pattern of holes provided in said fifth mask; and
   developing said second layer of material in accordance with said fourth pattern of holes provided in said fifth mask.

8. The method of claim 1 wherein said first layer of material comprises photoresist.

9. The method of claim 1, said second layer of material comprising photoresist.

10. The method of claim 1, said first layer of material comprising an insulating material.

11. The method of claim 1, said second layer of material comprising a photo sensitive insulating material.

12. The method of claim 1, with an additional step of cross-linking said first layer of material.

13. The method of claim 1, with an additional step of hardening said first layer of material.

14. The method of claim 1, said holes of said second pattern being created by adding one additional hole to each side of holes of said first pattern.

15. The method of claim 14, said one additional hole being separated from said each side of holes of said first pattern by an equal distance.

16. The method of claim 15, said equal distance being within a range of between one time and two times the size of a largest cross section of said first hole.

17. The method of claim 14, said one additional hole having a cross section of a size about equal to a cross section of holes of said first pattern.

18. The method of claim 14, said one additional hole added to each side of holes of said first pattern being eliminated where said one additional hole overlaps holes of said first pattern of holes.

19. The method of claim 1 wherein overlapping holes of said second pattern of holes are combined into larger holes.

20. The method of claim 1, said third pattern being more dense than said first pattern.

21. The method of claim 1, said fourth pattern being more dense than said second pattern.

22. A method of creating closely spaced contact holes, comprising:
   providing a substrate, said substrate having been provided with a layer of dual-polarity resist for creation of a pattern of contact holes;
   exposing said layer of dual-polarity resist with a mask, said mask comprising a first and a second pattern of contact holes, creating a first and a second pattern of exposure in said layer of dual-polarity resist, said first and second pattern of contact holes having a first and second critical dimension, said first and second pattern of contact holes being interspersed;
   selectively exposing said layer of dual-polarity resist to a source of radiation, said selective exposure being in accordance with said second pattern of exposure in said layer of dual-polarity resist, thereby inhibiting creating openings in said layer of dual-polarity resist in accordance with said second pattern of exposure, said selective exposure comprising a range of critical dimensions being equal to or larger than said second critical dimension; and
   developing said layer of dual-polarity resist in accordance with exposure.

23. The method of claim 22, said first pattern of exposure comprising contact holes.

24. The method of claim 22, said second pattern of exposure comprising dummy holes.

25. The method of claim 22, said second pattern of contact holes being more dense than said first pattern of contact holes.

26. A method of creating closely spaced contact holes, comprising:
providing a substrate, said substrate having been provided with a layer of dual-polarity resist for creation of a pattern of contact holes;
exposing said layer of photoresist with a mask, said mask comprising a first and a second pattern of contact holes, creating a first and a second pattern of exposure in said layer of dual-polarity resist, said first and second patter dimension, said first and second pattern of contact holes being interspersed;
selectively exposing said layer of photoresist to a source of radiation, said selective exposure being in accordance with said second pattern of exposure in said layer of dual-polarity resist, thereby hardening said layer of photoresist, inhibiting creating openings in said layer of photoresist in accordance with said second pattern of exposure, said selective exposure comprising a range of critical dimensions being equal to or larger than said first critical dimension; and
developing said layer of photoresist in accordance with said first pattern of exposure.

27. The method of claim 26, said first pattern of holes comprising contact holes.

28. The method of claim 26, said second pattern of holes comprising dummy holes.

29. The method of claim 26, said second pattern of contact holes being more dense than said first pattern of contact holes.

30. A packed mask for creating closely spaced contact holes, comprising:
a first mask comprising a first and a second pattern of contact holes, said first pattern of contact holes having a first critical dimension, said second pattern of contact holes having a second critical dimension, said first and second pattern being interspersed;
a second mask comprising a third pattern of holes, said third pattern of holes being aligned with said second pattern of holes, said third pattern of holes being a transparent pattern of holes with a surrounding opaque background surface, said third pattern of holes having a third critical dimension, said third critical dimension comprising a range of critical dimensions being equal to or larger than said second critical dimension.

31. The packed mask of claim 30, said first pattern of holes comprising contact holes.

32. The packed mask of claim 30, said second pattern of holes comprising dummy holes.

33. The packed mask of claim 30, said holes of said second pattern being created by adding one additional hole to each side of holes of said first pattern.

34. The packed mask of claim 33, said one additional hole being separated from said each side of holes of said first pattern by an equal distance.

35. The packed mask of claim 34, said equal distance being within a range of between one time and two time the size of a largest cross section of said first hole.

36. The packed mask of claim 34, said one additional hole having a cross section of a size about equal to a cross section of holes of said first pattern.

37. The packed mask of claim 33, said one additional hole added to each side of holes of said first pattern being eliminated where said one additional hole overlaps holes of said first pattern of holes.

38. The packed mask of claim 30, overlapping holes of said second pattern of holes being combined into larger holes.

39. The packed mask of claim 30, said second pattern being more dense than said first pattern.

40. A packed mask for creating closely spaced contact holes, comprising:
a first mask comprising a first and a second pattern of contact holes, said first pattern of contact holes having a first critical dimension, said second pattern of contact holes having a second critical dimension, said first and second pattern being interspersed;
a third mask comprising a third pattern of holes, said third pattern of holes being aligned with said first pattern of holes, said third pattern of holes being an opaque pattern of holes with a surrounding transparent background surface, said third pattern of holes having a third critical dimension, said third critical dimension comprising a range of critical dimensions being equal to or larger than said first critical dimension.

41. The packed mask of claim 40, said first pattern of holes comprising contact holes.

42. The packed mask of claim 40, said second pattern of holes comprising dummy holes.

43. The packed mask of claim 42, said one additional hole being separated from said each side of holes of said first pattern by an equal distance.

44. The packed mask of claim 43, said equal distance being within a range of between one time and two time the size of a largest cross section of said first hole.

45. The packed mask of claim 40, said holes of said second pattern being created by adding one additional hole to each side of holes of said first pattern.

46. The packed mask of claim 45, said one additional hole having a cross section of a size about equal to a cross section of holes of said first pattern.

47. The packed mask of claim 45, said one additional hole added to each side of holes of said first pattern being eliminated where said one additional hole overlaps holes of said first pattern of holes.

48. The packed mask of claim 40, overlapping holes of said second pattern of holes being combined into larger holes.

49. The packed mask of claim 40, said second pattern being more dense than said first pattern.

50. A packed mask for creating closely spaced contact holes, comprising:
a first mask comprising a first and a second pattern of contact holes, said first pattern of contact holes having a first critical dimension, said second pattern of contact holes having a second critical dimension, said first and second pattern being interspersed;
a fourth mask comprising a fourth pattern of holes, said fourth pattern of holes being aligned with said second pattern of holes, said fourth pattern of holes being transparent pattern of holes with a surrounding opaque background surface, said fourth pattern of holes having a four critical dimension, said fourth critical dimension comprising a range of critical dimensions being equal to or larger than said second critical dimension.

51. The packed mask of claim 50, said first pattern of holes comprising dummy holes.

52. The packed mask of claim 50, said second pattern of holes comprising contact holes.

53. The packed mask of claim 50, said holes of said second pattern being created by adding one additional hole to each side of holes of said first pattern.

54. The packed mask of claim 53, said one additional hole being separated from said each side of holes of said first pattern by an equal distance.

55. The packed mask of claim 54, said equal distance being within a range of between one time and two time the size of a largest cross section of said first hole.

56. The packed mask of claim 53, said one additional hole having a cross section of a size about equal to a cross section of holes of said first pattern.

57. The packed mask of claim 53, said one additional hole added to each side of holes of said first pattern being eliminated where said one additional hole overlaps holes of said first pattern of holes.

58. The packed mask of claim 50, overlapping holes of said second pattern of holes being combined into larger holes.

59. The packed mask of claim 50, said fourth pattern being more dense than said first pattern.

60. A packed mask for creating closely spaced contact holes, comprising:
- a first mask comprising a first and a second pattern of contact holes, said first pattern of contact holes having a first critical dimension, said second pattern of contact holes having a second critical dimension, said first and second pattern being interspersed;
- a fifth mask comprising a fourth pattern of holes, said fourth pattern of holes being aligned with said second pattern of holes, said fourth pattern of holes being an opaque pattern of holes with a surrounding transparent background surface, said fourth pattern of holes having a fourth critical dimension, said fourth critical dimension comprising a range of critical dimensions being equal to or larger than said first critical dimension.

61. The packed mask of claim 60, said first pattern of holes comprising dummy holes.

62. The packed mask of claim 61, said holes of said second pattern being created by adding one additional hole to each side of holes of said first pattern.

63. The packed mask of claim 62, said one additional hole being separated from said each side of holes of said first pattern by an equal distance.

64. The packed mask of claim 63, said equal distance being within a range of between one time and two time the size of a largest cross section of said first hole.

65. The packed mask of claim 62, said one additional hole having a cross section of a size about equal to a cross section of holes of said first pattern.

66. The packed mask of claim 62, said one additional hole added to each side of holes of said first pattern being eliminated where said one additional hole overlaps holes of said first pattern of holes.

67. The packed mask of claim 60, said second pattern of holes comprising contact holes.

68. The packed mask of claim 60, overlapping holes of said second pattern of holes being combined into larger holes.

69. The packed mask of claim 60, said third pattern being more dense than said first pattern.

* * * * *